(12) United States Patent
Wimplinger et al.

(10) Patent No.: US 9,806,054 B2
(45) Date of Patent: Oct. 31, 2017

(54) FLEXIBLE SUBSTRATE HOLDER, DEVICE AND METHOD FOR DETACHING A FIRST SUBSTRATE

(75) Inventors: Markus Wimplinger, Ried im Innkreis (AT); Jurgen Burggraf, Scharding (AT); Gerald Mittendorfer, Suben (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 14/366,990

(22) PCT Filed: Dec. 22, 2011

(86) PCT No.: PCT/EP2011/073851
§ 371 (c)(1),
(2), (4) Date: Aug. 12, 2014

(87) PCT Pub. No.: WO2013/091714
PCT Pub. Date: Jun. 27, 2013

(65) Prior Publication Data
US 2015/0096689 A1  Apr. 9, 2015

(51) Int. Cl.
*B32B 38/10* (2006.01)
*H01L 23/00* (2006.01)
(Continued)

(52) U.S. Cl.
CPC .......... *H01L 24/799* (2013.01); *B32B 43/006* (2013.01); *H01L 21/67092* (2013.01);
(Continued)

(58) Field of Classification Search
CPC . B32B 38/10; B32B 43/006; Y10T 156/1168; Y10T 156/1978
(Continued)

(56) References Cited

U.S. PATENT DOCUMENTS 5,768,980 A  6/1998  Degen .............................. 99/426
5,932,048 A  8/1999  Furukawa et al. ............ 156/153
(Continued)

FOREIGN PATENT DOCUMENTS

CN  102290367  12/2011  ........... H01L 21/687
CN  103460369  12/2013  ............. H01L 21/67
(Continued)

OTHER PUBLICATIONS

Office Action issued in corresponding Japanese Patent Application No. 2014-547725, dated Nov. 16, 2015.
(Continued)

*Primary Examiner* — Mark A Osele
*Assistant Examiner* — Nickolas Harm
(74) *Attorney, Agent, or Firm* — Kusner & Jaffe

(57) ABSTRACT

A flexible substrate mount for holding a first substrate when the first substrate is being detached from a second substrate, and detachment means for debonding of the second substrate by bending the first substrate. Furthermore, this invention relates to a device for detaching a first substrate from a second substrate in one detachment direction (L) with the following features: a substrate mount for holding the first substrate, said first substrate mount being flexible in the detachment direction (L), a substrate mount for holding the second substrate and detachment means for the debonding of the first substrate from the second substrate as the first substrate bends, and a method of using the same.

20 Claims, 5 Drawing Sheets

(51) Int. Cl.
*H01L 21/67* (2006.01)
*H01L 21/687* (2006.01)
*B32B 43/00* (2006.01)
*H01L 21/683* (2006.01)
*H01L 21/66* (2006.01)

(52) U.S. Cl.
CPC .... *H01L 21/6835* (2013.01); *H01L 21/68707* (2013.01); *H01L 21/68721* (2013.01); *H01L 21/68785* (2013.01); *H01L 22/10* (2013.01); *H01L 24/98* (2013.01); *B32B 38/10* (2013.01); *B32B 2457/14* (2013.01); *H01L 2924/0002* (2013.01); *Y10T 156/11* (2015.01); *Y10T 156/1168* (2015.01); *Y10T 156/1978* (2015.01)

(58) Field of Classification Search
USPC .................................................. 156/714, 764
See application file for complete search history.

(56) References Cited

U.S. PATENT DOCUMENTS

| | | | |
|---|---|---|---|
| 6,343,784 B1 | 2/2002 | Jourde et al. | 269/187 |
| 6,431,623 B1 | 8/2002 | Roeters et al. | 294/64.1 |
| 7,381,628 B2 * | 6/2008 | Sparks | B81B 1/00 257/414 |
| 8,157,615 B2 | 4/2012 | Thallner | 451/7 |
| 8,267,143 B2 | 9/2012 | George et al. | 156/758 |
| 8,360,129 B2 | 1/2013 | Ebata et al. | 156/764 |
| 8,366,873 B2 | 2/2013 | George | 156/707 |
| 8,459,779 B2 * | 6/2013 | Joyner, II | B41J 2/1603 347/61 |
| 8,530,334 B2 | 9/2013 | Lagahe et al. | 438/458 |
| 8,551,291 B2 | 10/2013 | George | 156/706 |
| 8,722,515 B2 | 5/2014 | Lagahe et al. | 438/458 |
| 8,950,459 B2 | 2/2015 | George et al. | 156/762 |
| 2001/0014514 A1 | 8/2001 | Geusic | 438/455 |
| 2004/0040186 A1 | 3/2004 | Wilson | 38/102.2 |
| 2004/0166653 A1 | 8/2004 | Kerdiles et al. | 438/458 |
| 2005/0150597 A1 | 7/2005 | Henley et al. | 156/344 |
| 2007/0013014 A1 * | 1/2007 | Guo | C23C 14/021 257/417 |
| 2008/0020573 A1 | 1/2008 | Birkmeyer et al. | 438/689 |
| 2008/0032501 A1 * | 2/2008 | Klein | B81C 1/00579 438/669 |
| 2008/0305721 A1 | 12/2008 | Ohashi et al. | 451/41 |
| 2009/0017248 A1 | 1/2009 | Larson et al. | 428/41.5 |
| 2009/0218560 A1 | 9/2009 | Flaim et al. | 257/9 |
| 2009/0258583 A1 * | 10/2009 | Thallner | B32B 43/006 451/289 |
| 2009/0314430 A1 | 12/2009 | Nakamura | 156/344 |
| 2010/0184269 A1 | 7/2010 | Noda | 438/458 |
| 2010/0224320 A1 | 9/2010 | Tsai et al. | 156/344 |
| 2010/0279435 A1 * | 11/2010 | Xu | B24B 55/02 438/5 |
| 2011/0198040 A1 * | 8/2011 | Ebata | B65H 41/00 156/750 |
| 2011/0308739 A1 * | 12/2011 | McCutcheon | H01L 21/187 156/766 |
| 2012/0261076 A1 * | 10/2012 | Moriceau | B28D 5/0011 156/701 |
| 2014/0020847 A1 | 1/2014 | Burggraf et al. | 156/714 |
| 2015/0101744 A1 | 4/2015 | George et al. | H01L 21/6835 |

FOREIGN PATENT DOCUMENTS

| | | | |
|---|---|---|---|
| DE | 102008018536 | 10/2009 | .......... H01L 21/673 |
| EP | 2 398 040 A1 | 12/2011 | ............ H01L 21/00 |
| EP | 2398041 | 12/2011 | ............ H01L 21/00 |
| FR | 2783970 | 9/1998 | ............ H01L 21/68 |
| JP | 2006-278807 A | 10/2006 | ............ H01L 21/02 |
| JP | 2010-135682 A | 6/2010 | ............ H01L 21/02 |
| JP | 2011-510495 | 3/2011 | ............ H01L 21/02 |
| JP | 2012-4522 | 1/2012 | .......... H01L 21/683 |
| TW | 200849582 A | 12/2008 | ............ H01L 27/32 |
| TW | 200946628 | 11/2009 | ................ C09J 5/00 |
| TW | 201133583 | 10/2011 | ............ H01L 21/30 |
| WO | WO 00/76899 A1 | 6/2000 | .............. B66C 1/02 |
| WO | WO 2009/090236 | 7/2009 | ............ H01L 21/20 |

OTHER PUBLICATIONS

International Search Report for International Application No. PCT/EP2011/055630, dated Nov. 7, 2011.
Office Action issued in connection with corresponding Taiwanese Patent Application No. 101102305 (English-language translation included) dated Feb. 16, 2015.
Office Action issued in connection with corresponding Japanese Patent Application No. JP 2014-504171, dated Nov. 4, 2014.
U.S. Appl. No. 61/169,753, filed Apr. 16, 2009.
U.S. Appl. No. 61/552,140, filed Oct. 27, 2011.
Continuation U.S. Appl. No. 14/870,139, filed Sep. 30, 2015, Burggraf et al., entitled: Bendable Carrier Mount, Device and Method for Releasing a Carrier Substrate.
Office Action issued in connection with corresponding Taiwanese Patent Application No. TW 101127341, dated Dec. 18, 2015.
Office Action issued in connection with corresponding Chinese Patent Application No. CN 201180075733.6, dated Jan. 4, 2016.
Office Action issued in corresponding Japanese Patent Application No. 2014-547725 dated Aug. 16, 2016.
Office Action issued in related U.S. Appl. No. 14/870,139 dated Sep. 13, 2016.

* cited by examiner

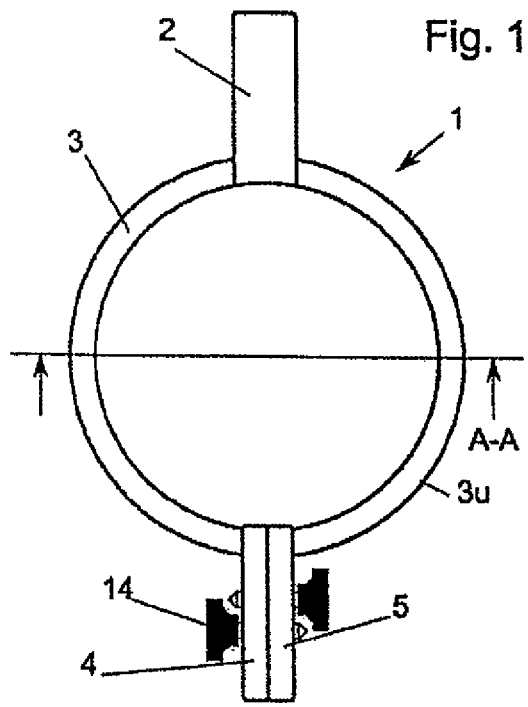
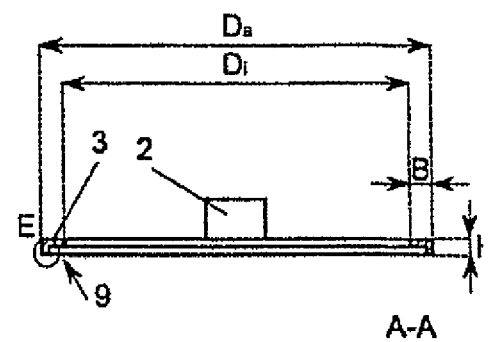
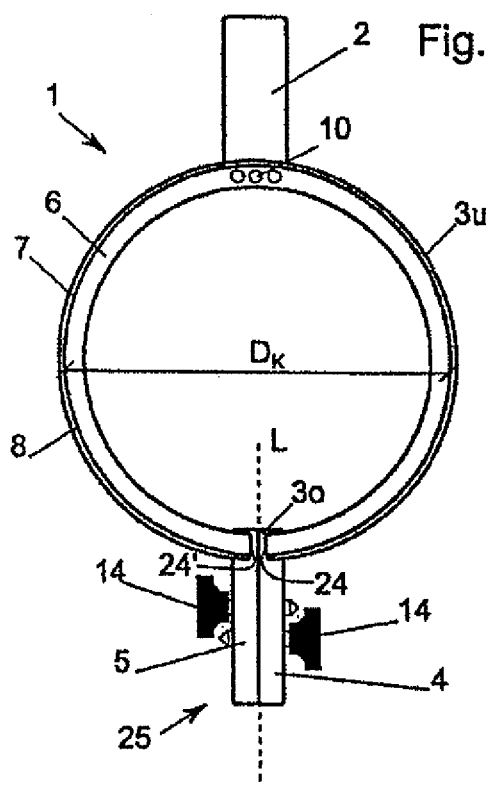
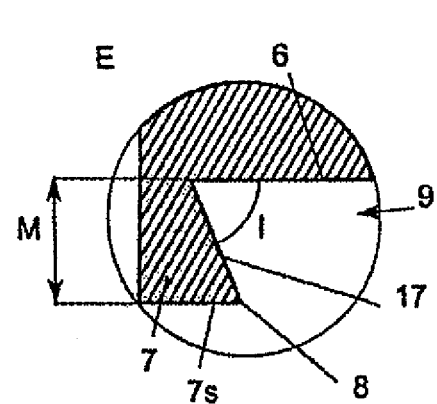

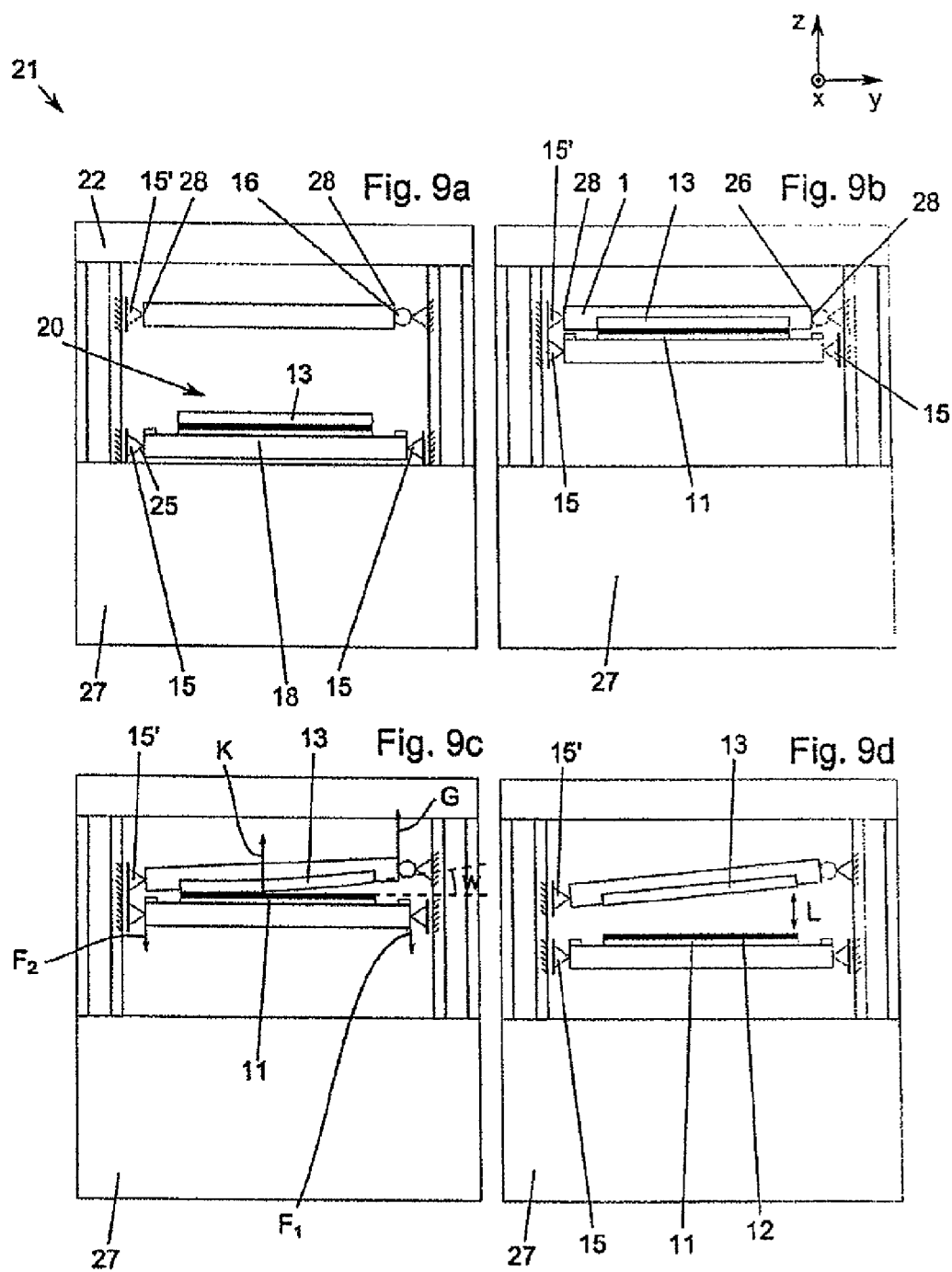

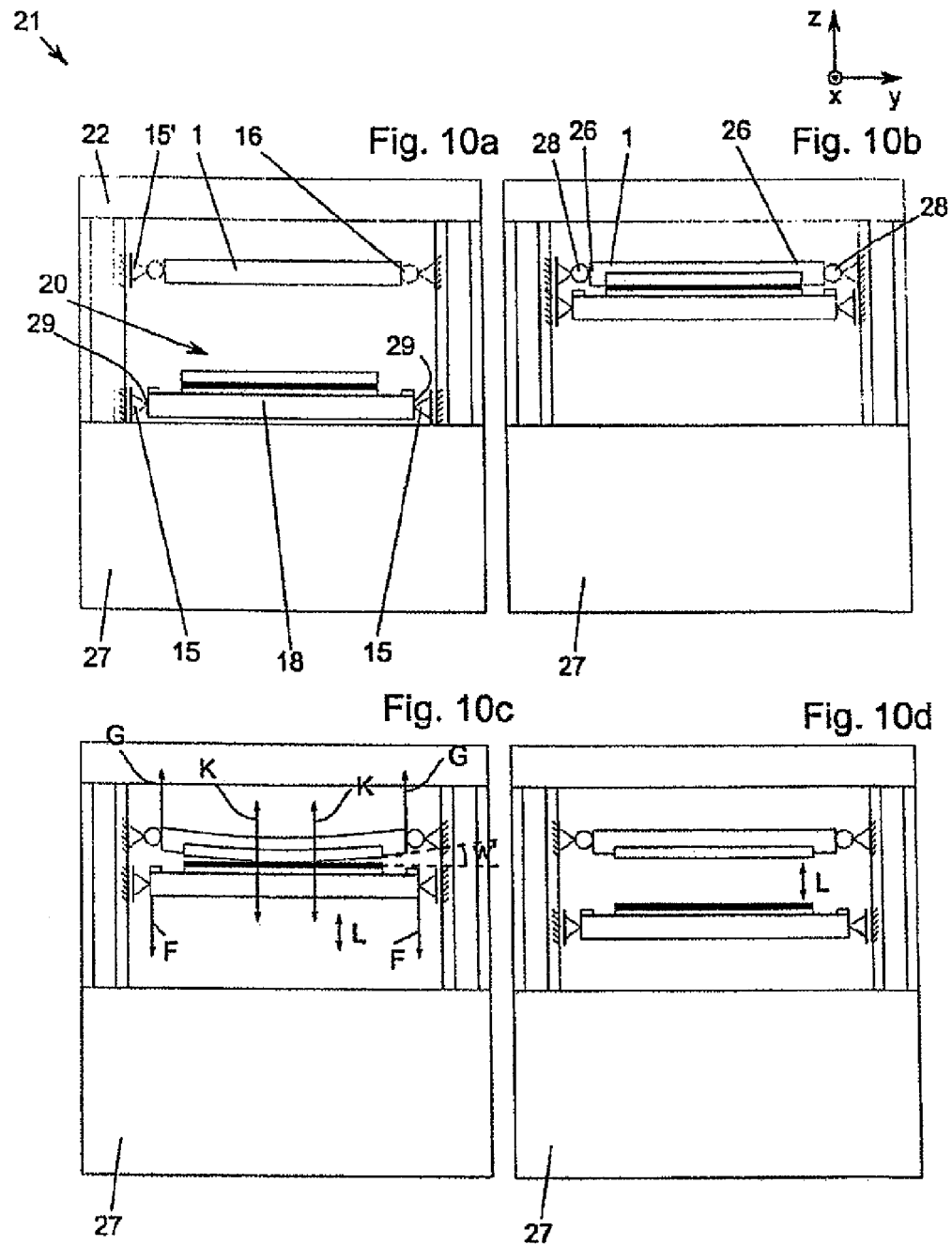

FLEXIBLE SUBSTRATE HOLDER, DEVICE AND METHOD FOR DETACHING A FIRST SUBSTRATE

FIELD OF THE INVENTION

The invention relates to a flexible substrate mount and a method and a device for detaching a first substrate from a second substrate in one detachment direction L.

BACKGROUND OF THE INVENTION

In the semiconductor industry, structure wafers or product wafers are often temporarily bonded onto carrier wafers or first substrates in order to be able to handle them. After processing of the product wafers, they should be removed from the first substrate as simply, promptly, economically and cleanly as possible. The method which is most often used for bonding of product wafers on a carrier wafer is the application of an adhesion layer to one of the two substrates (or both substrates) and contact-making under pressure. When debonding, the carrier wafer is debonded from the product wafer after reducing the adhesion force of the adhesive (temperature, UV radiation, etc.), for example by parallel displacement of the wafers against one another. The wafers are held by so-called chucks by negative pressure. Very often wafers are also permanently connected by fusion bonding (mainly van der Waals forces) and subsequent annealing (heating above the recrystallization temperature).

During debonding a plurality of critical factors must be considered; the highest priority consists in exposing the brittle product wafers, which are very expensive due to preprocessing, to as little stress as possible so as not to damage them. On the other hand, the debonding of the first substrate should take place economically and promptly with minimum possible energy expenditure. In a plurality of known debonding processes, it is necessary, especially for dissolving the adhesion properties of the adhesion layer between the wafers, to heat up the stack of carrier wafers and structure wafers/product wafers to a temperature which is specific to the adhesive.

The object of this invention is to develop generic devices and methods for debonding from the first substrates wherein careful, and at the same time much faster, debonding is enabled. At the same time, the energy consumption will be reduced.

Advantageous developments of the invention are given in the dependent claims. All combinations of at least two of the features given in the specification, the claims and/or the figures also fall within the framework of the invention. At the given value ranges values which lie within the indicated boundaries will also be considered disclosed as boundary values and will be claimed in any combination.

SUMMARY OF THE INVENTION

The basic idea of this invention is to build a substrate mount for holding the first substrate during the detachment of the first substrate from the second substrate such that the substrate mount is made to allow bending of the first substrate. According to the invention, the substrate mount has a sufficient bending stiffness to cause a detachment force for debonding the first substrate from the second substrate, especially by lifting, especially exclusively, from the edge of the first substrate. According to the invention, only a slight deflection, especially <45° bending angle, preferably <40°, even more preferably <30°, especially preferably <20°, even more preferably <10°, most preferably <5°, should take place. The deflection is controlled by controllable application of force and/or control of the debonding rate, especially on the periphery, of the substrate mount. In this way, the first substrate, which also has a certain bending strength which is similar to the substrate mount, and above all the second substrate are protected against damage. Due to the bending, most of the detachment force acts on the migrating detachment front which migrates from the edge of the first substrate in the direction of the center. Furthermore, the embodiment as claimed in the invention is also suited to separating substrates with a (relatively) high bond force from one another.

Thus, the invention can also be used especially in the detachment of two substrates which have been joined by fusion bonding, since both the first and also the second substrate are carefully treated by the controllable bending during detachment.

The core of the invention is therefore a flexible substrate mount for holding a first substrate when the first substrate is being detached from a second substrate, there being detachment means for debonding the second substrate as the first substrate is bending on the substrate mount.

Blanket, non-annular versions of the substrate mount are also conceivable as claimed in the invention, especially of a polymer with a certain elasticity or bending stiffness. They would have vacuum passages for fixing (i.e., securing) and holding the first substrate. In addition, there can be electrostatic fixing of the first substrate on the substrate mount for increasing the holding force.

The substrate mount can also be comprised at least partially of metal, ceramic or a composite material. The materials used need allow only the functionality as claimed in the invention.

As an independent invention, there is, moreover, a device for detaching a first substrate from a second substrate in one detachment direction L with the following features:
 a first substrate mount which is flexible in the detachment direction L for holding the first substrate,
 a second substrate mount for holding the second substrate and
 detachment means for the debonding of the first substrate from the second substrate with bending of the first substrate, which debonding is controlled with respect to the force which causes the bending.

Here it is advantageous if the second substrate mount is used for accommodating the more sensitive, especially thinner (preferably the product wafer) substrate.

The detachment direction L, as claimed in the invention, is essentially, preferably exactly, normal to the surface of the first substrate and/or second substrate. One bending axis of the bending of the substrate mount and/or of the first substrate which is accommodated by the substrate mount is normal to the detachment direction L. The bending axis is especially parallel to the surface of the second substrate and/or of the first substrate. It is conceivable, as claimed in the invention, that there are several, radially symmetrical, detachment directions along the periphery of the substrates so that there are several bending axes. This case would occur if the two substrates were to be separated from one another by a tool intervention, especially a holding ring, along the periphery.

The device, as claimed in the invention in one advantageous version, can comprise a pressure chamber which is exposed to an overpressure in order to fix a first substrate which has been fixed with negative pressure on the substrate mount even more strongly on it. The pressure in the chamber here can be >1 bar, preferably >2 bar, even more preferably >5 bar, still more preferably >10 bar, especially less than 100 bar.

According to one advantageous embodiment of the invention, it is provided that the substrate mount for accommodating the first substrate is elastically deformable in the detachment direction L. The elasticity of the substrate mount as claimed in the invention enables concentration of the detachment force on the migrating detachment front, although an especially controllable tensile force is applied only on the periphery of the first substrate.

In another advantageous embodiment of the invention, it is provided that at least one tensile force which is acting on the periphery of the second substrate mount for accommodating the second substrate and at least one opposing force which acts against the tensile force on the periphery of the first substrate mount can be applied along a detachment front by the detachment means for generating detachment moments. This can reduce the overall loading, especially at the start of debonding. In this way, still stronger protection of the first and the second substrate is effected. Here it is provided that the tensile forces are added up to a resulting tensile force in the center of the second substrate mount by uniform application of tensile forces on the periphery of the second substrate mount, while the opposing force or the opposing forces add up to a resulting opposing force on one edge of the first substrate mount as well as corresponding detachment moments on the migrating detachment front. The first substrate mount is accordingly tilted relative to the second substrate mount.

For even greater protection of the second substrate, especially for very sensitive or very expensive second substrates, it is provided, as claimed in the invention, that the second substrate mount be made as a rigid receiver which holds especially the second substrate over its entire surface.

According to another advantageous embodiment of the invention, it is provided that the first and/or second substrate mount is made as an especially open ring with an adjustable inside diameter $D_i$. Due to the ring shape, the bending stiffness can also be optimally adjusted to the first substrate by the ring geometry, especially the ring width B to the ring diameter $D_a$, and/or to the height H of the ring. The ring shape furthermore results in that greater freedom of movement of the first substrate is allowed in the region of the ring opening so that an interaction of the bending stiffness of the substrate mount and the bending stiffness of the first substrate is achieved. Here the bending stiffness of the first substrate mount is especially at least equal to or higher than the bending stiffness of the first substrate. It is advantageous to make the second substrate mount different from the first substrate mount, not as an open ring, but preferably as a blanket substrate receiver, especially as a chuck.

The bending stiffness of the first substrate mount is advantageously chosen, as claimed in the invention, such that it is in a region between 1/20 to 20 times, especially between 1/10 to 10 times, preferably between 1/5 to 5 times, even more preferably between 1/2 to 2 times, the bending stiffness of the first substrate. The first substrate is especially a wafer of silicon with a thickness d between 500 μm and 750 μm, preferably 600 μm. It can have a diameter $D_I$ of 200 mm or 300 mm.

It is especially advantageous to provide holding means which run especially over the entire ring periphery, especially in the form of a rebounding peripheral shoulder. Thus, with a simple geometrical shape which can be economically produced, both the detachment force can be applied to the first substrate, on the entire periphery of the first substrate, and the critical initiation of the detachment front can be concentrated on one or more locations on the periphery of the carrier substrate at the start of the debonding.

In a development, it is provided, as claimed in the invention, that the substrate mount is made completely, especially at least to 98% of the periphery, preferably at least to 99%, even more preferably to at least 99.5%, to be laterally enclosing. In this way, the first substrate is supported more or less over the entire periphery. The substrate mount is made as a ring which is peripherally closed preferably at least to 98% of the periphery, even more preferably at least to 99%, even more preferably to at least 99.5%. The ring can also be composed of individual segments.

According to one advantageous embodiment, the detachment means have translational drive means for inducing a translational movement of at least one peripheral section of the first substrate mount for accommodating the first substrate in the detachment direction L.

An independent invention is a method for detaching a first substrate from a second substrate in one detachment direction L with the following steps:
  holding the second substrate with a second substrate mount and holding the first substrate with a first substrate mount which is flexible in the detachment direction L and
  debonding of the first substrate from the second substrate as the first substrate bends.

Furthermore, as claimed in the invention, there is a use of a flexible first substrate mount for holding the first substrate when the first substrate is being debonded from the second substrate. In particular, a flexible substrate mount is also used as a second substrate mount.

In one advantageous embodiment of the invention, it is provided that the debonding takes place at a temperature <200° C., preferably <100° C., still more preferably <50° C., ideally at ambient temperature, without blanket heating means. As claimed in the invention, the debonding takes place at a temperature below the temperature at which permanent connection of the first and/or second substrate takes place, namely, at a recrystallization temperature of the substrate.

The method as claimed in the invention is developed in that the debonding of the first substrate takes place after bonding by means of van der Waals forces and before heating of the first and second substrate to a temperature above which a permanent connection of the first and/or second substrate takes place.

One type of connection that would be advantageous is made such that detachment takes place up to a bond strength of more than $0.2 \ J/m^2$, preferably more than $0.4 \ J/m^2$, more preferably more than $0.8 \ J/m^2$. The fracture strength of a $SiO_2$ bulk is roughly $2.0-2.5 \ J/m^2$.

It is conceivable, as claimed in the invention, to accelerate the debonding, especially on the detachment front, by acting locally on the detachment front by the detachment means, especially by separation means. The separation means can comprise mechanical separation and/or local heat-up, preferably a directed heating air flow. Specifically, a separating wedge, a separating blade, a separating wire or a preferably hot compressed air jet which is directed at the detachment front can be provided individually or in combination. In the art, this and similar techniques are used to carry out a so-called "cleaving," which is the splitting of a substrate, generally of a very brittle substrate such as Si or Ge, along a weakened region, in order to transfer thin and ultrathin layers. The embodiment, as claimed in the invention, can likewise be used for these cleaving processes.

A separating wedge is defined as a tool with a preferably v-shaped profile. A separating blade is defined as a tool with an extremely sharp edge. The separating wire is a very thin, preferably high-strength wire which is pushed by a corresponding apparatus in the tensioned state in the plane of the intermediate layer onto the latter. The separating wire is made especially as a heating wire, therefore heatable.

As claimed in the invention, an embodiment is also conceivable in which the detachment front runs more or less helically during the detachment along the periphery of the second substrate to the inside toward the center. This is achieved by the detachment forces which are acting on the periphery being raised rotationally on the periphery.

An independent invention is the use of the carrier mount or the device or the method for debonding of a first substrate from a second substrate, which first substrate is connected to a second substrate, solely by means of van der Waals forces. This applies especially to fusion bonded substrates which have not yet been subjected to annealing or whose bond strength is still below 1.0 J/m².

The first and/or second substrate is worked $SiO_2$ wafers.

Thus, as claimed in the invention, when providing a testing step (method) or a testing apparatus (device), the separation of an already at least partially bonded substrate pair is conceivable. To the extent the testing of the bonded substrate pair (first and second substrate) shows that given quality criteria are not satisfied or not completely satisfied, a debonding, as claimed in the invention, is effected. Quality criteria are defined largely but not exclusively as physical and/or chemical bond strength, calibration accuracy of the two substrates to one another or a blanket bond interface, therefore a bond interface which does not have unbonded sites. In any case any other type of discovered states or processes and/or states or processes which have occurred and which are not explicitly mentioned but are undesirable in all cases, can force a debonding, as claimed in the invention. The first and/or second substrate can be supplied to reworking and can be rebonded, optionally even in a new combination of a first and second substrate. Thus a rework and/or refurbishing is enabled, as claimed in the invention, up to a later instant of the production process. With the rework and/or refurbishing, a rebonding of the substrates without corresponding faults is enabled and thus the yield in the production process is drastically increased.

The described features apply analogously to the device, as claimed in the invention, and the method, as claimed in the invention, as well as the use, as claimed in the invention.

Other advantages, features and details of the invention will become apparent from the following description of preferred exemplary embodiments and using the drawings.

BRIEF DESCRIPTION OF THE DRAWINGS

FIG. 1 shows a plan view of the substrate mount as claimed in the invention with a cutting line A-A, FIG. 2 shows a cross sectional view of the substrate mount according to cutting line A-A from FIG. 1, FIG. 3 shows a view of the substrate mount according to FIG. 1 from underneath, FIG. 4 shows a detailed view of detail E from FIG. 2, FIGS. 9*a*-9*d* shows a device, as claimed in the invention, according to a first embodiment with four method steps, as claimed in the invention and FIGS. 10*a*-10*d* show a second embodiment of the device, as claimed in the invention, with four method steps.

DETAILED DESCRIPTION OF PREFERRED EMBODIMENT

Figure 5A:
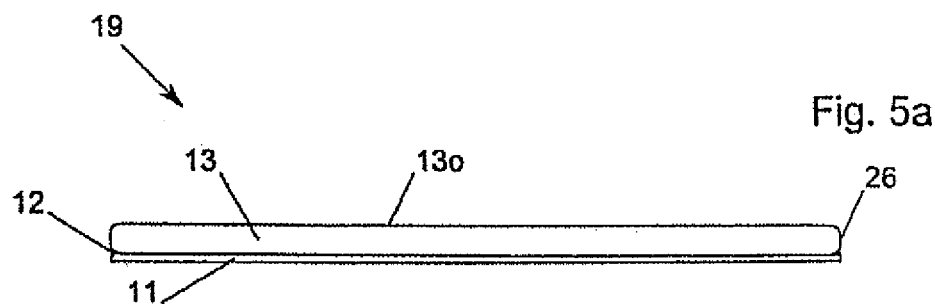
FIG. 5*a* shows a side view of a stack of a first substrate, the interconnection layer and a second substrate.
Figure 5B:
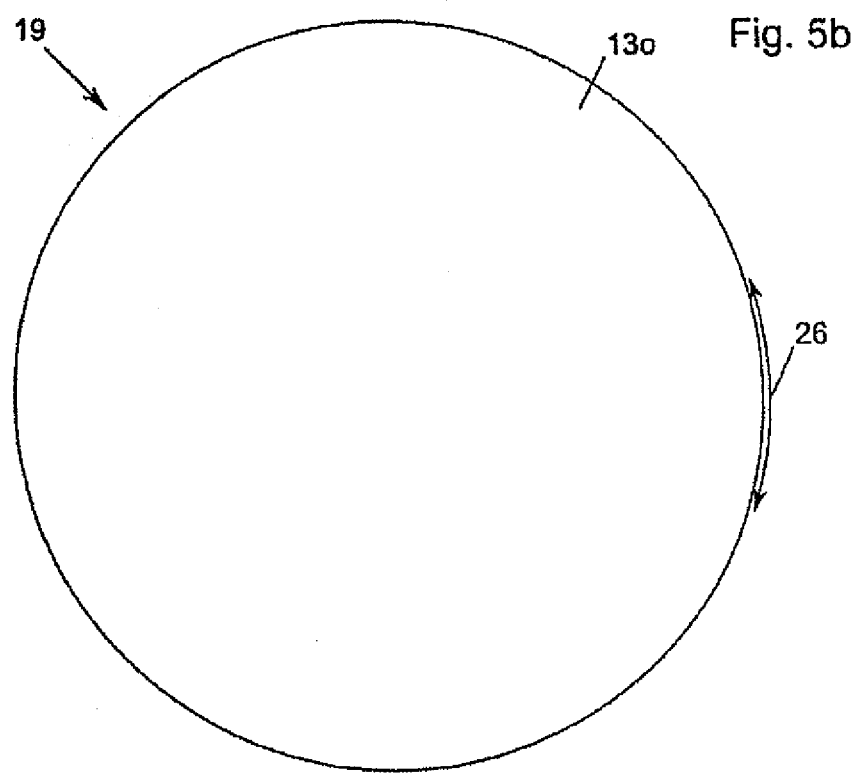
FIG. 5*b* shows a plan view of a stack of the first substrate, the interconnection layer and a second substrate.

The same components, or components with the same action, are identified in the figures with the same reference numbers.

FIG. 1 shows a substrate mount 1 which can be used semiautomatically, in which the accommodation of a first substrate 13 (here: more stable carrier substrate) takes place manually by the substrate mount 1. The substrate mount 1 is used for debonding the first substrate 13 from a second substrate 11 (here: product substrate) which is connected by an interconnection layer 12 to the first substrate 13.

The substrate mount 1 is comprised of a grip 2 located on a peripheral section 26 and a ring 3 which is opened opposite the grip 2. On the opening 3*o* of the ring 3 on the opposite ends 24, 24' of the ring 3 there are spacers 25 for adjusting the distance A between the ends 24, 24'. An inside diameter $D_i$ and an outside diameter $D_a$ of the ring 3 can be adjusted by setting the distance A. The spacers 25 in this exemplary embodiment are comprised of levers 4, 5, the lever 4 being placed on the end 24 and the lever 5 on the end 24'. The levers 4, 5 are penetrated by actuating elements 14 which can be operated manually. Automatic implementation of the above-described manual kinematics is conceivable as claimed in the invention.

The grip 2 is attached to the ring 3 by fixing elements 10, namely, screws. The material of the ring 3 as claimed in the invention for a given geometry (ring height H, ring width B, outside diameter $D_a$, inside diameter $D_i$) should be chosen such that the ring 3 can be elastically bent by the spacers 25, against its force which is caused by the bending stiffness.

Figure 6:
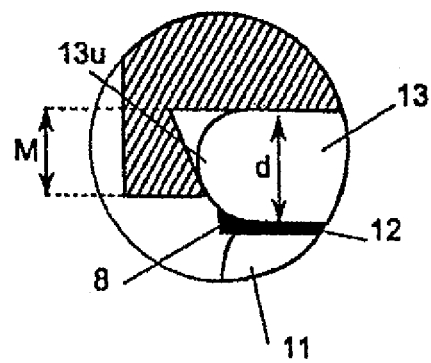
FIG. 6 shows a detail view analogously to FIG. 4 with a first embodiment of the substrate mount.
Figure 7:
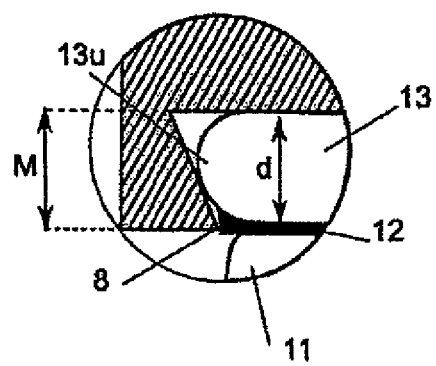
FIG. 7 shows a detail view analogously to FIG. 4 with a second embodiment of the substrate mount.

The ring 3 has a peripheral shoulder 7 which projects from a ring offset 6 and forms a step 9. The step 9 runs in a z-shape with an inner angle 45°<I<90°, especially <80°, preferably <70° which is pointed toward the middle of the ring and thus forms a peripheral wall bevel 17 which ends on a sharp inner edge 8. The inner edge 8 is at the same time a component of a face surface 7*s* of the peripheral shoulder 7, which surface 7*s* runs parallel to the ring offset 6. The end, i.e. face, surface 7*s* is equidistant to the ring offset 6 with a distance M. As best seen in FIG. 7, the distance M is at maximum slightly larger (especially larger by the thickness of the interconnection layer 12) than the thickness d of the first substrate 13. Preferably, the distance M as in FIG. 6 is chosen such that it is smaller than the thickness d of the first substrate 13. Preferably, the distance M is at least half as large as the thickness d of the first substrate 13.

The spacers 25 can increase a diameter $D_k$ for holding the first substrate 13, which diameter $D_k$ is formed by the inner edge 8 and which lies between the inside diameter $D_i$ and the outside diameter $D_a$ until the first substrate 13 can be inserted through an opening formed on the inside edge 8 (diameter $D_k$) as far as the ring offset 6. Then the diameter $D_k$ is again reduced by the spacers 25 until one peripheral edge 13*u* of the first substrate 13 adjoins the bevel 17 of the peripheral shoulder 7 and is fixed by the latter. Thus, the first substrate 13 is held by the flexible substrate mount 1. The holding takes place more or less by clamping and/or form-fit. For clamping of the first substrate 13 on the bevel 17, there can be dynamometer means for controlling the squeezing, especially on the actuating means 14.

The second substrate 11 (here: product substrate) is attached to the substrate mount 1 only via the interconnection layer 12. There is no direct contact between the substrate mount 1 and the second substrate 11. When avoiding contact between the substrate mount 1 and the second substrate 11, the second substrate 11 is most heavily protected and contamination or damage is essentially precluded.

The second substrate 11 with the interconnection layer 12 and the first substrate 13 form a stack 19 (first substrate-second substrate-combination). Likewise, this invention is suitable for a combination of the first substrate and second substrate without an interposed interconnection layer, especially for so-called prebonds in which the wafers adhere to one another especially by means of van der Waals forces.

The sharp inner edge 8 is used in the fixing of the stack 19 on the substrate mount 1 in the embodiment shown in FIG. 7. At the same time, the sharp inner edge 8 is used as separating means or for initiation of debanding by the tip of the inner edge 8 on the peripheral edge of the interconnection layer 12 penetrating into the interconnection layer 12.

In a use for substrate pairs without interconnection layer 12, especially for fusion-bonded wafers, the interconnection layer 12 described here is the boundary surface (on which the van der Waals forces act) between the substrate pair.

The substrate mount 1 almost completely surrounds the first substrate 13, except for the ring opening 3o.

Figure 8:
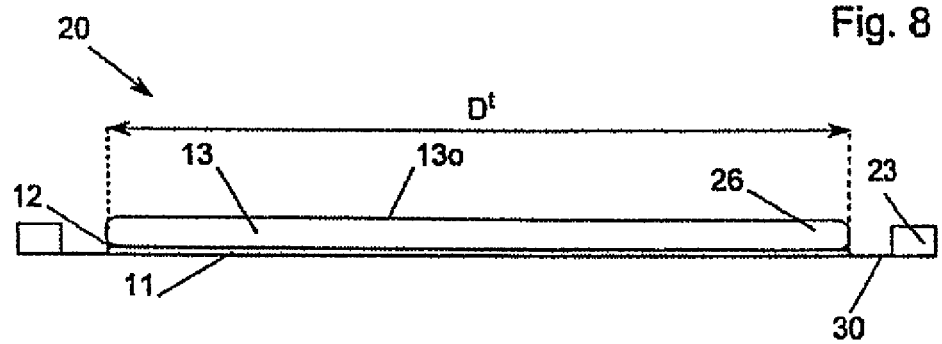
FIG. 8 shows a stack fixed on a film frame.

FIG. 8 shows the stack 19 on a film frame 23, the second substrate 11 being connected to a film 21 which is connected to the film frame 23, the stack 19, the film frame 23 and the film 21 forming a film frame combination 20.

The first substrate 13 can be pulled off the second substrate 11 by means of the grip 2 and by fixing, i.e. holding, of the second substrate 11 or the film frame 23. The tensile force is applied by the unilateral arrangement of the grip 2 laterally on the first substrate 13, in other words, on the peripheral section 26. Initiated by the penetration of the inner edge 8 into the interconnection layer 12, the first substrate 13 is slowly debonded with deformation of the first substrate 13 and of the ring 3 (against its force generated by the bending stiffness) proceeding from the peripheral section 26 to the opposing side. In doing so, a detachment front migrates from the peripheral section 26 up to the opposite side of the first substrate 13 through the interconnection layer 12. Along the detachment front, defined torques act accordingly, depending on the distance of the detachment front from the grip 2 and the detachment force which has been applied to the grip 2.

In automated form, this is shown in a first embodiment in FIGS. 9a to 9d and in a second embodiment in FIGS. 10a to 10d, which are detailed below.

The use of the above-described (first) substrate mount 1 for holding the first substrate 13 in a form suitable for automation is common to the two embodiments.

One important inventive aspect is that at the start of debonding, therefore in the initiation of the debonding, there should be especially careful treatment, especially by implementation of a mechanical partial solution of the interconnection layer on the periphery or on its edge.

FIGS. 9 and 10 each show a base 27 and a rack 22. The rack 22 is set up on the base 27 for providing a stable base structure and for attachment of other components of the device as claimed in the invention, which is described below. On the rack 22 and/or the base 27, between a cover 22d of the rack 22 and a bottom 27b formed by the base 27, there are drive means 15' for translational movement (especially driven) of the (first) substrate mount 1 or of peripheral sections of the substrate mount 1 and drive means 15 for translational movement (especially driven) of a second substrate mount 18 (receiver) which holds the stack 19 or the film frame combination 20. The drive means 15' can have a trip-free mechanism in the translation direction, formed by a movable bearing.

The substrate mount 18 in the two embodiments according to FIG. 9 and FIG. 10 can be moved in translation in one detachment direction L, therefore up and/or down in the plane of the drawings. The drive means 15 for driving the substrate mount 18 can be moved especially synchronously, preferably driven by motors which are controlled by a central control means, such as stepping motors.

In the embodiment according to FIG. 9, for the substrate mount 1 there is only one drive means 15' on the side of the substrate mount 1 opposite the peripheral section 26, while on the peripheral section 26 there is a spherical plane bearing 16, wherein the substrate mount 1 can be pivoted around the spherical plane bearing 16 but is fixed in the detachment direction L. Thus, the sequence of the method is as follows.

In the method step shown in FIG. 9a, the substrate mount 1 which is suitable for the film frame combination 20, especially the first substrate 13, is attached to the upper drive means 15' and the spherical plane bearing 16. At the same time, beforehand or subsequently the film frame combination 20 is fixed on the substrate mount 18, especially by application of a vacuum. The substrate mount 18 can be moved by the drive means 15 in the detachment direction L.

As claimed in the invention, it is alternatively conceivable that on the periphery of the substrate mount 1 there are several, especially two drive means 15' on one side and several, especially two spherical plane bearings 16 on the opposite side.

The substrate mount 1 can be fixed, i.e. attached, on the drive means 15' and the spherical plane bearing 16 by holding means 28 which are located on the ring periphery 3u. The substrate mount 18 can be fixed, i.e. attached, by holding means 29 on the drive means 15.

Then the substrate mount 18 is moved into the position which is shown in FIG. 9b (i.e., in the detachment direction L toward the substrate mount 1) by the drive means 15 executing a synchronous translation movement of the substrate mount 18 until the first substrate 13 with its top 13o adjoins the ring offset 6. The control can take place via the central control means, the meeting of the first substrate 13 with the ring offset 6 being recognized by dynamometer means which are integrated into the substrate mount 18. Preferably on the periphery of the substrate mount 18, there is provided a number n of force transducers distributed at an angular distance of $360°/n$.

So that the first substrate 13 can be accommodated in the substrate mount 1, the diameter $D_k$ must be matched accordingly beforehand to the inside edge 8 of the ring 3 so that the first substrate 13 with its outer contour (especially circular with a diameter $D_t$) can be received into the substrate mount 1. The inside diameter $D_i$ in the accommodation of the first substrate 13 is smaller than the diameter $D_t$ of the first substrate 13 so that the first substrate 13 does not slip through. As soon as the position which is shown in FIG. 9b is reached, the inside diameter $D_i$ can be reduced until the first substrate 13 is fixed in the substrate mount 1 (see FIGS. 6 and 7), i.e., adjoins the wall bevel 17.

As soon as the position which is shown in FIG. 9b has been reached, the upper fixable drive means 15' is released so that it has a degree of freedom in the detachment direction L and the side of the substrate mount 1 attached to the drive means 15' can move freely in the detachment direction L. In this embodiment, the drive means 15' is made drive-less. But a control of the motion by a central control means is also conceivable, as claimed in the invention, so that the drive means 15' is made, not passive (as in the preferred embodiment), but active.

Then on the two drive means 15, which are provided oppositely on the substrate mount 18, a driving force $F_1$ (tensile force) which is pointed away from the substrate mount 1 and a driving force $F_2$ (tensile force) which is especially identical to the driving force $F_1$ are applied to the substrate mount 18 especially synchronously for debonding of the first substrate 13 which is fixed on the substrate mount 1 from the second substrate 11.

There is an opposing force G (or several opposing forces G if there are several spherical plane bearings 16) on the spherical plane bearing 16 acting opposite the driving forces $F_1$ and $F_2$ and especially parallel to them.

In this way, the debonding process which has been initiated from the inner edge 8 is continued, wherein a detachment front runs with increasing bending of the substrate mount 1 and of the first substrate 13 from the spherical plane bearing 16 to the opposite the side of the substrate mount 1. Along the detachment front, in equilibrium with the driving forces $F_1$ and $F_2$ as well as the opposing force G (caused by the connecting force of the interconnection layer 12), torques act as detachment moments $K_1$ to $K_n$ which are distributed infinitesimally along the detachment front.

In the position which is shown in FIG. 9c, the first substrate 13 is debonded by more than half, the debonding taking place by both the first substrate 13 and also the substrate mount 1 deforming (against the bending strength of the substrate mount 1 and of the first substrate 13).

In the position which is shown in FIG. 9d, the first substrate 13 is debonded completely from the second substrate 11. The interconnection layer 12 in the figure adheres to the second substrate 11, but can also adhere partially or completely to the first substrate 13.

During the debonding, the substrate mount 1 bends and the first substrate 13 bends by a (average, especially measured at half debonding of the first substrate 13 from the second substrate 11) bending angle $1°<W<45°$, especially $W<35°$, preferably about $6°$.

In the second embodiment as shown in FIGS. 10a to 10d, instead of the drive means 15', there is a spherical plane bearing 16 on the substrate mount 1 so that the substrate mount 1 is fixed on the peripheral sections 26 and an opposite peripheral section 26' (therefore where the spherical plane bearings 16 are attached to holding means 28 of the substrate mount 1) in the detachment direction L (as claimed in the invention there can be several spherical plane bearings 16 on the periphery of the substrate mount 1). In sections between the peripheral sections 26, the substrate mount 1 can move within the framework of its flexibility against the bending stiffness. When driving forces are applied in the method step according to 10c, a detachment front arises which runs essentially concentrically (rippled) from the periphery of the interconnection layer 12 toward the middle of the interconnection layer 12. In doing so, the initiation by the inner edge 8 of the substrate mount plays an important part for overcoming the initial connecting force of the interconnection layer 12.

The detachment moments $K_1$ to $K_n$ in the embodiment according to FIGS. 10a to 10d as the detachment front advances act primarily on a (rippled) circular section along the detachment front. While the bending angle W according to FIG. 9c is measured [on] the side edge opposite the spherical plain bearing, the bending angle W' is measured from the center of the first substrate 13 to the edge due to the detachment force K acting from all sides on the periphery. The bending angle W' in this case, due to the shorter distance, is accordingly smaller to the extent the material of the substrate mount 1 and of the first substrate 2, as well as their dimensions, are otherwise identical. By reducing the ring width B and/or the ring height H, the bending stiffness of the ring 3 can be reduced so that the bending angle W' would increase.

REFERENCE NUMBER LIST 1 first substrate mount
2 grip
3 ring
3o opening
3u ring periphery
4 lever
5 lever
6 ring offset
7 peripheral shoulder
7s end face
8 inner edge
9 step
10 fixing means
11 second substrate
12 interconnection layer
13 first substrate
13o top
13u peripheral edge
14 actuating elements
15, 15' drive means
16 spherical plain bearing
17 bevel
18 second substrate mount
19 stack
20 film frame combination
21 film
22 rack
22d cover
23 film frame
24, 24' ends
25 spacer
26 peripheral section
27 base
27b bottom
28 holding means
29 holding means
A distance
B ring width
$D_i$ inner diameter
$D_a$ outer diameter
$D_k$ diameter
H ring height
M distance
L detachment direction
l inner angle
d thickness
$F_1$, $F_2$, $F_n$ driving forces (tensile force)
G opposing force
$K_1$, $K_2$, $K_n$ detachment moments W, W' bending angle Having described the invention, the following is claimed:

1. A method for processing first and second substrates, said method comprising:
   providing the first and second substrates as a bonded pair, wherein the first and second substrates are directly bonded together in a fusion bonding process by means of van der Waals forces, said bonded pair not having been subjected to annealing;
   holding the second substrate with a second substrate mount;
   holding the first substrate with a first substrate mount which is flexible in a detachment direction (L) for bending of the first substrate, wherein the detachment direction (L) is generally normal to a planar surface of the second substrate;
   debonding the first substrate from the second substrate in the detachment direction (L), wherein one or more forces are applied to overcome the van der Waals forces of the fusion bonding process, said step of debonding includes bending the first substrate, wherein the step of debonding the first substrate from the second substrate takes place after a bonding of the first substrate to the second substrate by means of the van der Waals forces, but prior to heating to a temperature at which a permanent bond is formed between substrates; and
   at least one of the first substrate and the second substrate subjected to the debonding is permanently bonded to another substrate by heating to a temperature at which the substrates permanently bond to each other.

2. The method as claimed in claim 1, wherein the step of debonding includes applying the one or more forces to overcome a bond strength of more than 0.2 J/m² between the first substrate and the second substrate.

3. The method as claimed in claim 2, wherein the method further comprises:
   examining the bonded pair of the first and second substrates prior to debonding to determine a quality criteria, wherein the step of debonding the first and second substrates is performed only if the quality criteria fails to meet a defined criteria.

4. The method as claimed in claim 3, wherein the quality criteria include one or more of the following: physical bond strength, chemical bond strength, calibration accuracy of the first and second substrates to one another, and blanket bond interface.

5. The method as claimed in claim 1, wherein the method further comprises:
   examining the bonded pair of the first and second substrates prior to debonding to determine a quality criteria, wherein the step of debonding the first and second substrates is performed only if the quality criteria fails to meet a defined criteria.

6. The method as claimed in claim 5, wherein the quality criteria include one or more of the following: physical bond strength, chemical bond strength, calibration accuracy of the first and second substrates to one another, and blanket bond interface.

7. The method as claimed in claim 1, wherein the step of debonding further comprises:
   applying at least one tensile force acting on the periphery of the second substrate mount, and
   applying at least one opposing force (G) against the at least one tensile force, the at least one opposing force (G) acting on the periphery of the first substrate mount to produce detachment moments along a detachment front between the first and second substrates.

8. The method as claimed in claim 1, wherein the step of debonding further comprises:
   applying at least one tensile force to the second substrate mount in the detachment direction (L), and
   applying at least one opposing force to the first substrate mount in a direction generally opposite to said at least one tensile force.

9. The method as claimed in claim 1, wherein the step of debonding further comprises:
   applying at least one tensile force to the second substrate mount in a first direction; and
   applying at least one opposing force to the first substrate mount in a second direction that is generally opposite to the first direction, wherein the first substrate mounted to the first substrate mount bends in the detachment direction (L) to detach the first substrate from the second substrate.

10. The method as claimed in claim 1, wherein the method further comprises:
    adjusting a diameter ($D_k$) of an open ring of the first substrate mount to receive the first substrate.

11. A method of using a flexible first substrate mount to process first and second substrates, the method comprising:
    providing the first and second substrates as a bonded pair, wherein the first and second substrates are directly bonded together in a fusion bonding process by means of van der Waals forces, said bonded pair not having been subjected to annealing;
    holding the second substrate with a second substrate mount;
    holding the first substrate with the first substrate mount which is flexible in a detachment direction (L) for bending of the first substrate, wherein the detachment direction (L) is generally normal to a planar surface of the second substrate;
    debonding the first substrate from the second substrate in the detachment direction (L) by applying one or more forces to overcome the van der Waals forces of the fusion bonding process, said step of debonding includes bending the first substrate by flexing the first substrate mount in the detachment direction (L), wherein the step of debonding the first substrate from the second substrate takes place after a bonding of the first substrate to the second substrate by means of the van der Waals forces, but prior to heating to a temperature at which a permanent bond is formed between substrates; and
    at least one of the first substrate and the second substrate subjected to the debonding is permanently bonded to another substrate by heating to a temperature at which the substrates permanently bond to each other.

12. The method as claimed in claim 11, wherein the step of debonding includes applying one or more forces to overcome a bond strength between the first and second substrate of more than 0.2 J/m² between the first substrate and the second substrate.

13. The method as claimed in claim 12, wherein the method further comprises:
    examining the bonded pair of the first and second substrates prior to debonding to determine a quality criteria, wherein the step of debonding the first and second substrates is performed only if the quality criteria fails to meet a defined criteria.

14. The method as claimed in claim 13, wherein the quality criteria include one or more of the following: physical bond strength, chemical bond strength, calibration accuracy of the first and second substrates to one another, and blanket bond interface.

15. The method as claimed in claim 11, wherein the method further comprises:
   examining the bonded pair of the first and second substrates prior to debonding to determine a quality criteria, wherein the step of debonding the first and second substrates is performed only if the quality criteria fails to meet a defined criteria.

16. The method as claimed in claim 15, wherein the quality criteria include one or more of the following: physical bond strength, chemical bond strength, calibration accuracy of the first and second substrates to one another, and blanket bond interface.

17. The method as claimed in claim 11, wherein the method further comprises:
   adjusting a diameter ($D_k$) of an open ring of the first substrate mount to receive the first substrate.

18. A method for detaching a first substrate from a second substrate, said method comprising:
   providing the first and second substrates as a bonded pair, wherein the first and second substrates are directly bonded together in a fusion bonding process by means of van der Waals forces, said bonded pair not having been subjected to annealing;
   holding the second substrate with a second substrate mount;
   holding the first substrate with a first substrate mount which is flexible in a detachment direction (L) for bending of the first substrate, wherein the detachment direction (L) is generally normal to a planar surface of the second substrate; and
   examining the bonded pair of the first and second substrates to determine a quality criteria;
   if it is determined that the quality criteria meets a defined criteria, then heating the first and second substrates to a temperature at which a permanent bond is formed between the first and second substrates, and if it is determined that the quality criteria fails to meet the defined criteria, then debonding the first substrate from the second substrate in the detachment direction (L), said debonding including application of one or more forces to overcome the van der Waals forces of the fusion bonding process, wherein debonding of the first substrate from the second substrate takes place after a bonding of the first substrate to the second substrate by means of the van der Waals forces, but prior to heating to a temperature at which a permanent bond is formed between the substrates.

19. The method as claimed in claim 18, wherein the quality criteria include one or more of the following: physical bond strength, chemical bond strength, calibration accuracy of the first and second substrates to one another, and blanket bond interface.

20. The method as claimed in claim 18, wherein if it is determined that the quality criteria has met the defined criteria, then permanently bonding the first substrate to the second substrate by heating the first and second substrates to a temperature at which first and second substrates permanently bond to each other.

* * * * *